United States Patent
Lee et al.

(10) Patent No.: US 11,705,357 B2
(45) Date of Patent: Jul. 18, 2023

(54) SUBSTRATE PROCESSING SYSTEM INCLUDING ELECTROSTATIC CHUCK AND METHOD FOR MANUFACTURING ELECTROSTATIC CHUCK

(71) Applicant: SEMES CO., LTD., Chungcheongnam-do (KR)

(72) Inventors: Dong Mok Lee, Chungcheongnam-do (KR); Sang Kee Lee, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 313 days.

(21) Appl. No.: 17/032,099

(22) Filed: Sep. 25, 2020

(65) Prior Publication Data

US 2021/0111057 A1    Apr. 15, 2021

(30) Foreign Application Priority Data

Oct. 14, 2019    (KR) ........................ 10-2019-0127189

(51) Int. Cl.
   *H01L 21/683* (2006.01)
   *H01L 21/67* (2006.01)
   *C23C 16/458* (2006.01)

(52) U.S. Cl.
   CPC ...... *H01L 21/6833* (2013.01); *C23C 16/4586* (2013.01); *H01L 21/67069* (2013.01)

(58) Field of Classification Search
   CPC ........... H01L 21/6833; H01L 21/67069; C23C 16/4586
   (Continued)

(56) References Cited

U.S. PATENT DOCUMENTS 6,055,150 A * 4/2000 Clinton ............... H01L 21/6833
                                                    279/128
8,941,969 B2    1/2015 Thach et al.
(Continued)

FOREIGN PATENT DOCUMENTS

JP    2010218802 A     9/2010
JP    6404296 B2      10/2018
(Continued)

OTHER PUBLICATIONS

Korean Office Action issued in Korean Application No. 10-2019-0127189, dated Mar. 8, 2021, 6 pages.
(Continued)

*Primary Examiner* — Charlee J. C. Bennett
(74) *Attorney, Agent, or Firm* — RatnerPrestia

(57) ABSTRACT

Provided are an electrostatic chuck, which is manufactured to be reusable by removing a part of a dielectric layer except for a DC electrode and a heater electrode and depositing a new dielectric layer thereon, and a method for manufacturing the electrostatic chuck, and a substrate processing system including the electrostatic chuck. The method for manufacturing the electrostatic chuck includes, after using an electrostatic chuck, removing a portion of an upper part of a first dielectric layer of the electrostatic chuck where an electrode is not formed, depositing a second dielectric layer on the first dielectric layer from which the portion of the upper part has been removed, and patterning the second dielectric layer to enable reuse of the electrostatic chuck.

18 Claims, 7 Drawing Sheets

(58) Field of Classification Search
USPC .................................................. 156/345.34
See application file for complete search history.

(56) References Cited

U.S. PATENT DOCUMENTS

| | | | |
|---|---|---|---|
| 9,001,489 B2 | 4/2015 | Boyd, Jr. et al. | |
| 9,939,737 B2* | 4/2018 | Klomp | G03F 7/70708 |
| 2007/0217114 A1* | 9/2007 | Sasaki | C23C 16/4581 |
| | | | 361/145 |
| 2008/0308230 A1* | 12/2008 | Takahashi | H01L 21/6831 |
| | | | 156/345.52 |
| 2013/0120897 A1* | 5/2013 | Lin | H02N 13/00 |
| | | | 216/48 |
| 2014/0177123 A1* | 6/2014 | Thach | H01L 21/67103 |
| | | | 361/234 |
| 2015/0247231 A1* | 9/2015 | Nguyen | H01L 21/67103 |
| | | | 204/192.21 |
| 2018/0135157 A1* | 5/2018 | Jeong | C23C 4/123 |
| 2018/0166311 A1* | 6/2018 | Boyd, Jr. | C23C 4/02 |
| 2022/0270907 A1* | 8/2022 | Boyd, Jr. | C23C 16/0227 |

FOREIGN PATENT DOCUMENTS

| | | | | |
|---|---|---|---|---|
| KR | 101328492 B1 * | 11/2013 | ......... | H01L 21/6833 |
| KR | 20150099796 A | 9/2015 | | |
| KR | 20160004408 A | 1/2016 | | |
| KR | 20180129366 A | 12/2018 | | |
| KR | 20190067934 A | 6/2019 | | |
| KR | 20190079043 A | 7/2019 | | |
| KR | 20190115339 A | 10/2019 | | |

OTHER PUBLICATIONS

Korean Written Decision on Registration for Korean Application No. 10-2023-0007896, dated Feb. 27, 2023 with translation, 4 pages.

* cited by examiner

[FIG. 1]
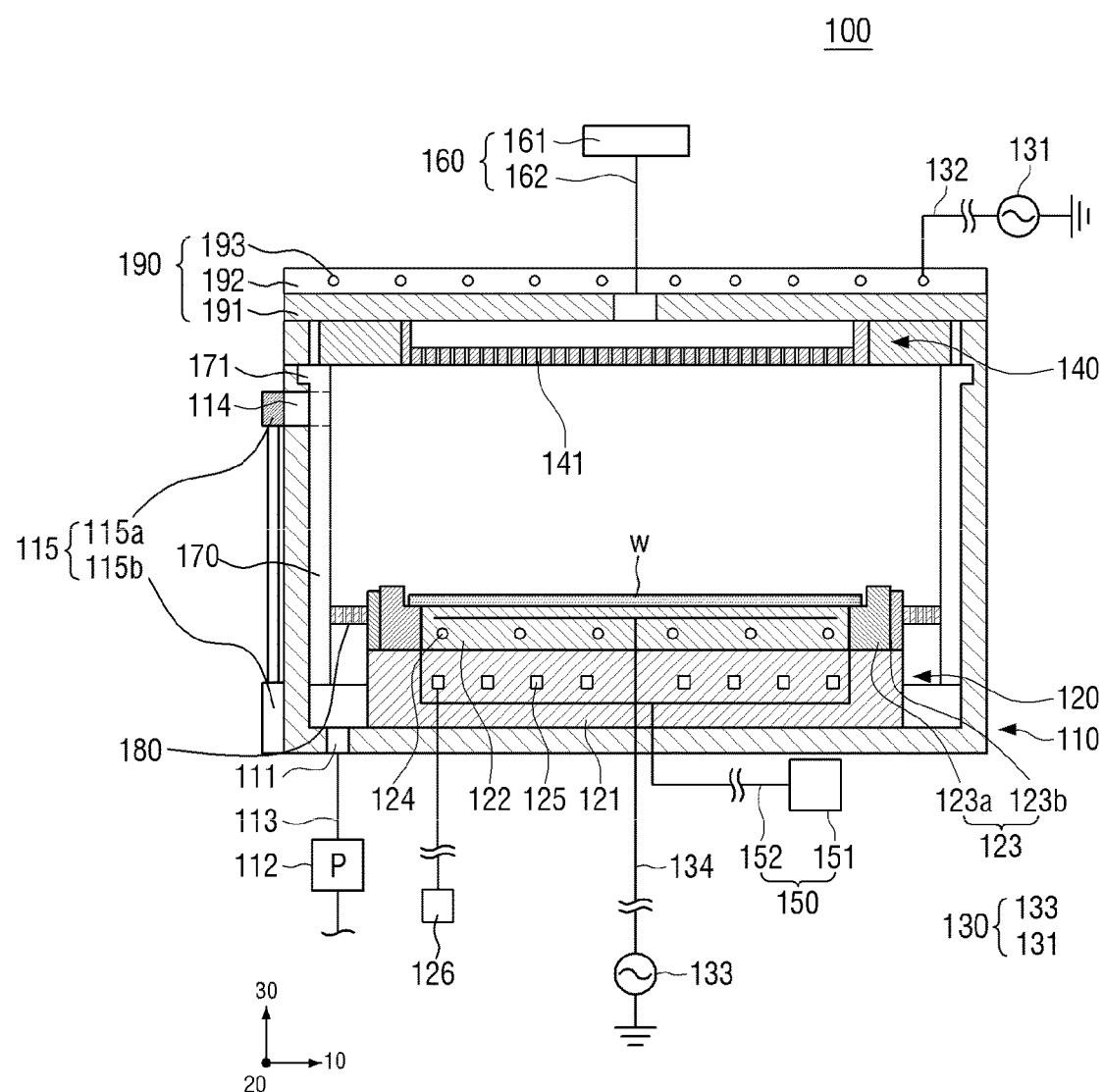

[FIG. 2]
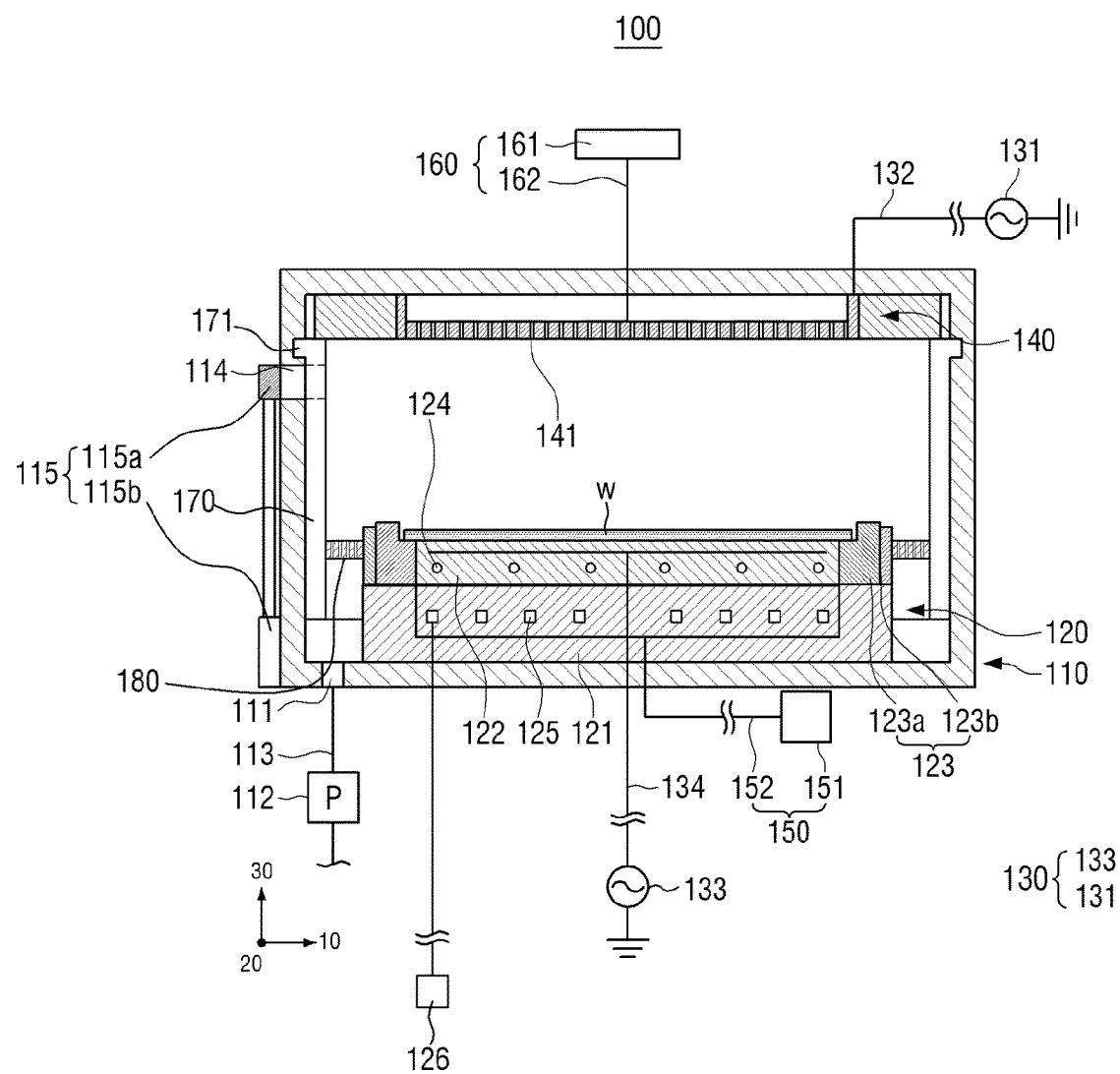

[FIG. 3]
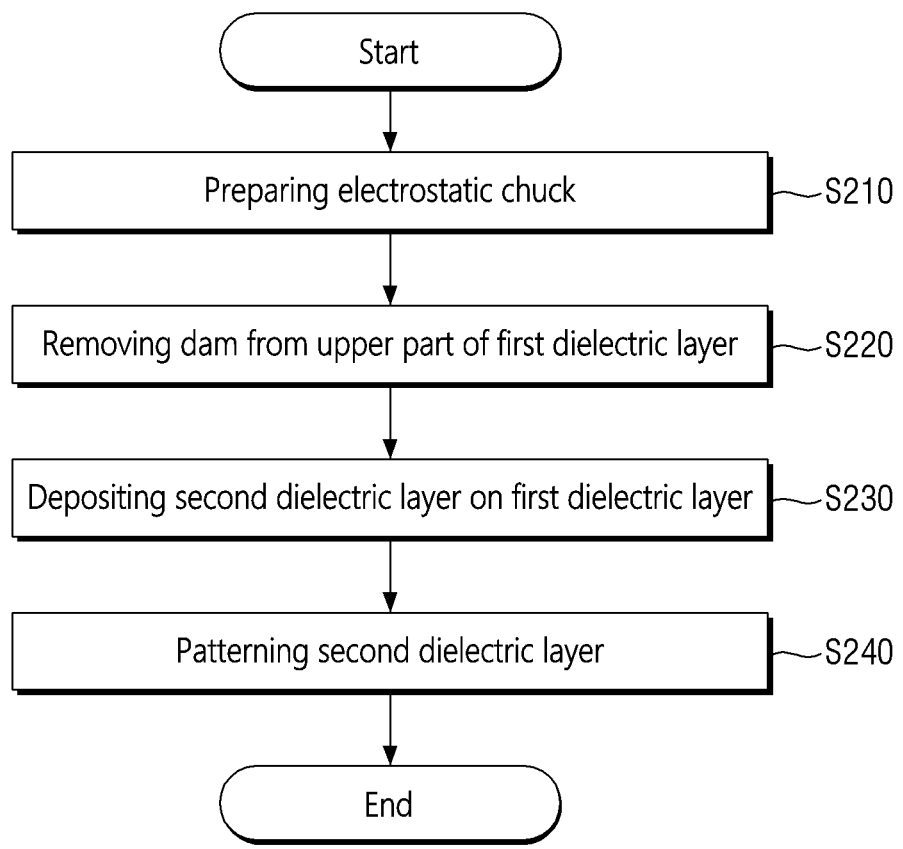

[FIG. 4]
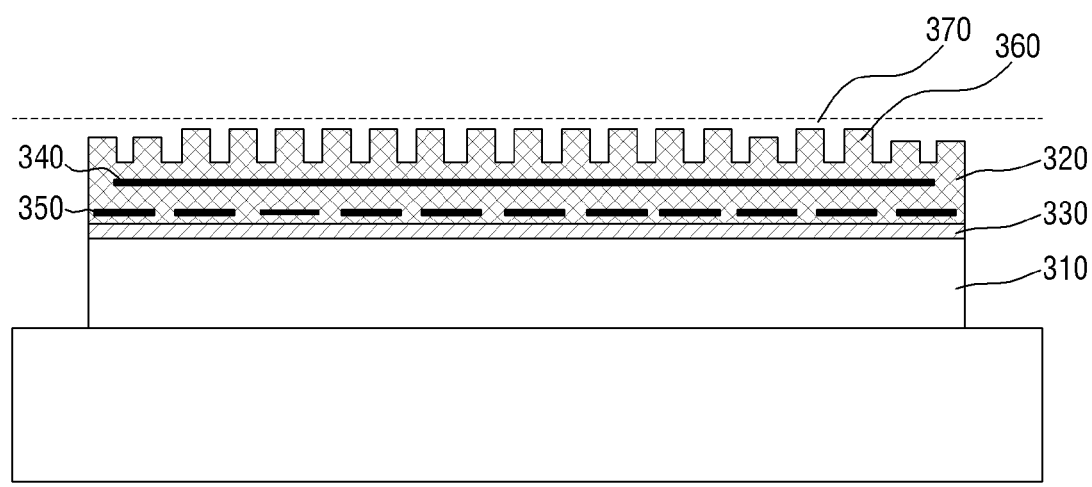

[FIG. 5]
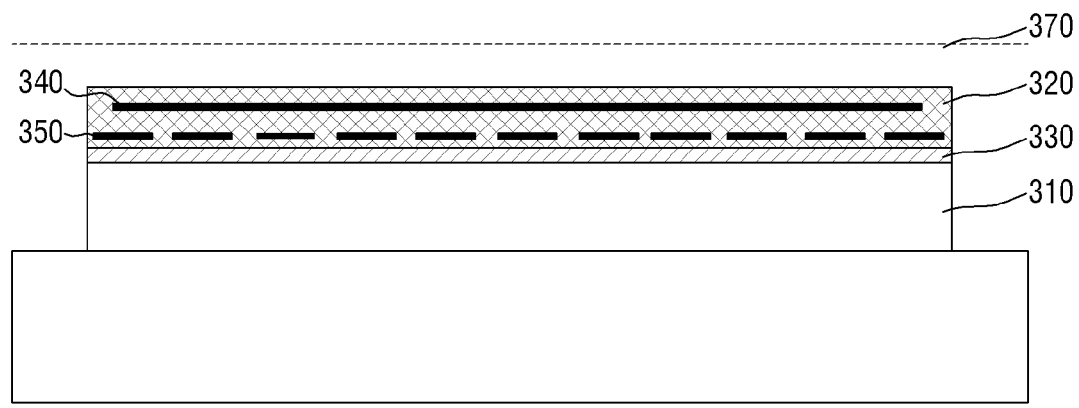

[FIG. 6]
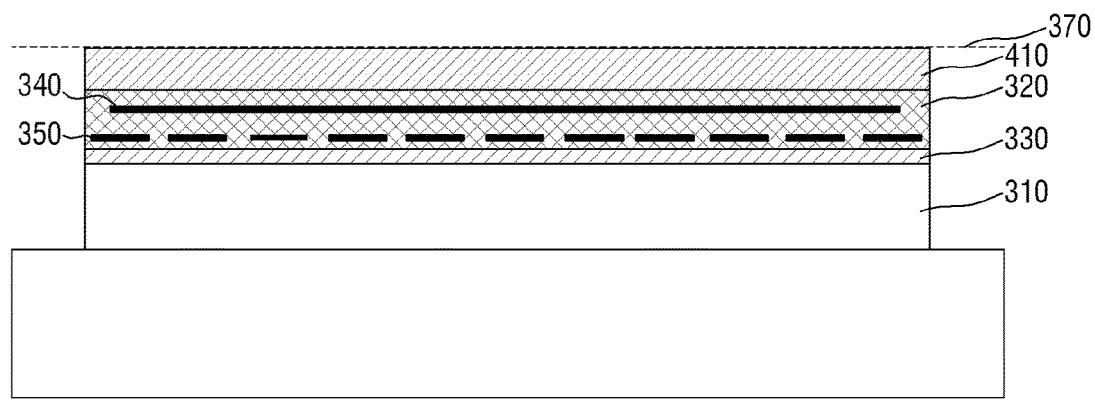

[FIG. 7]
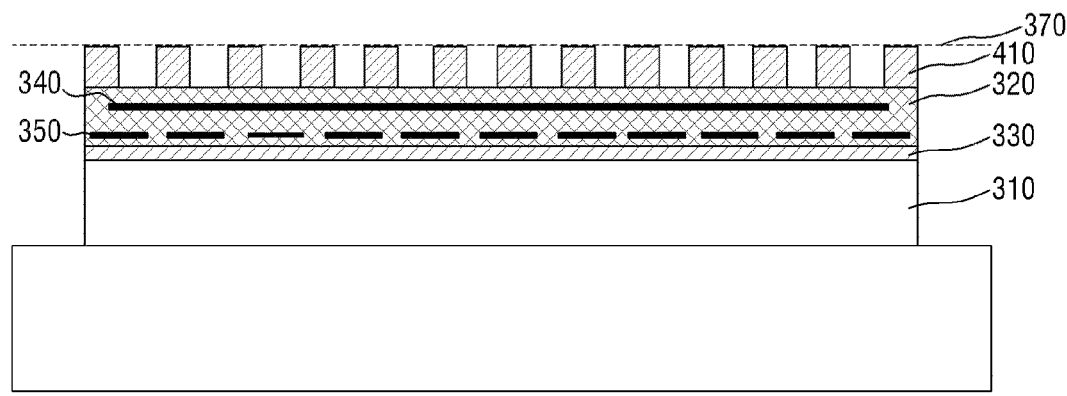

000# SUBSTRATE PROCESSING SYSTEM INCLUDING ELECTROSTATIC CHUCK AND METHOD FOR MANUFACTURING ELECTROSTATIC CHUCK

CROSS-REFERENCE TO RELATED APPLICATION

This application claims priority from Korean Patent Application No. 10-2019-0127189 filed on Oct. 14, 2019 in the Korean Intellectual Property Office, and all the benefits accruing therefrom under 35 U.S.C. 119, the contents of which in its entirety are herein incorporated by reference.

1. TECHNICAL FIELD

The present disclosure relates to an electrostatic chuck, a method for manufacturing the electrostatic chuck, and a substrate processing system including the electrostatic chuck. More particularly, the present disclosure relates to an electrostatic chuck manufactured to be reusable, a method for manufacturing the electrostatic chuck, and a substrate processing system including the electrostatic chuck.

2. DESCRIPTION OF THE RELATED ART

A semiconductor device may be manufactured by forming a predetermined pattern on a substrate. The predetermined pattern is formed on the substrate in such a way of performing a plurality of processes including a depositing process, a lithography process, and an etching process in series in facility for the semiconductor manufacturing process.

Since an electrostatic chuck (ESC) used to manufacture the semiconductor device is equipment expensive to purchase, reusing the electrostatic chuck has been recommended.

In order to reuse the electrostatic chuck, it is necessary to remove the entire dielectric layer including a DC electrode and a heater electrode and entirely regenerate a dielectric layer.

However, the regeneration of the entire dielectric layer has disadvantages that it is time consuming and expensive to pattern electrodes again and laminate a dielectric layer.

SUMMARY

Aspects of the present disclosure provide an electrostatic chuck, which is manufactured to be reusable by removing a part of a dielectric layer except for a DC electrode and a heater electrode and depositing a new dielectric layer thereon, and a method for manufacturing the electrostatic chuck.

Aspects of the present disclosure also provide a substrate processing system including an electrostatic chuck which is manufactured to be reusable by removing a part of a dielectric layer except for a DC electrode and a heater electrode and depositing a new dielectric layer thereon.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method for manufacturing an electrostatic chuck, the method comprising: after using an electrostatic chuck (ESC), removing a portion of an upper part of a first dielectric layer of the electrostatic chuck where an electrode is not formed; depositing a second dielectric layer on the first dielectric layer from which the portion of the upper part has been removed; and patterning the second dielectric layer to enable reuse of the electrostatic chuck.

A dam may be installed at the upper part of the first dielectric layer, and the removing may comprise removing the dam to remove the portion of the upper part.

The depositing may comprise depositing the second dielectric layer on the first dielectric layer using an aerosol deposition process.

The depositing may comprise depositing the second dielectric layer on the first dielectric layer such that the second dielectric layer has a height of 1 μm to 50 μm.

The depositing may comprise depositing the second dielectric layer on the first dielectric layer such that the second dielectric layer includes at least one component selected from the group consisting of aluminum nitride (AlN), silicon carbide (SiC), aluminum oxide ($Al_2O_3$), yttrium oxide ($Y_2O_3$), yttrium oxyfluoride (YOF), and sapphire.

The patterning may comprise patterning the second dielectric layer such that a dam is formed at an upper part of the second dielectric layer.

The patterning may comprise patterning the second dielectric layer to form a dam of the same type as a dam formed at the upper part of the first dielectric layer before using the electrostatic chuck.

The dam formed at the upper part of the second dielectric layer may have the same height as the dam formed at the upper part of the first dielectric layer before using the electrostatic chuck.

The electrode may include a DC electrode used to process the substrate and a heater electrode used to control a temperature of the substrate.

The removing may comprise removing the dam if a height of the dam is not constant.

The second dielectric layer may include the same component as the first dielectric layer, or a component having etching resistance.

According to another aspect of the present disclosure, there is provided an electrostatic chuck manufactured by removing a portion of an upper part of a first dielectric layer of the electrostatic chuck where an electrode is not formed after the electrostatic chuck is used in a substrate processing process while supporting a substrate in facility where the substrate processing process is performed, depositing a second dielectric layer on the first dielectric layer from which the portion of the upper part has been removed, and patterning the second dielectric layer to enable reuse of the electrostatic chuck.

According to yet another aspect of the present disclosure, there is provided a method for manufacturing an electrostatic chuck, the method comprising: after using an electrostatic chuck, removing a portion of an upper part of a first dielectric layer of the electrostatic chuck where an electrode is not formed; depositing a second dielectric layer on the first dielectric layer from which the portion of the upper part has been removed; and patterning the second dielectric layer to enable reuse of the electrostatic chuck, wherein a dam is installed at the upper part of the first dielectric layer, the removing comprises removing the dam to remove the portion of the upper part if a height of the dam is not constant, the patterning comprises patterning the second dielectric layer such that a dam is formed at an upper part of the second dielectric layer, and the second dielectric layer includes a component having etching resistance.

According to a further aspect of the present disclosure, there is provided a substrate processing system comprising: a housing; a shower head unit installed on an upper side inside the housing to introduce a process gas for etching a substrate into the housing; and a support unit installed on a lower side inside the housing, the support unit including an electrostatic chuck on which the substrate is mounted, a base configured to support the electrostatic chuck, and a focus ring installed on a side surface of the electrostatic chuck, wherein the electrostatic chuck is manufactured by removing a portion of an upper part of a first dielectric layer of the electrostatic chuck where an electrode is not formed after the electrostatic chuck is used to process the substrate, depositing a second dielectric layer on the first dielectric layer from which the portion of the upper part has been removed, and patterning the second dielectric layer to enable reuse of the electrostatic chuck.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a cross-sectional view schematically illustrating an exemplary structure of a substrate processing system including a substrate support unit manufactured according to an exemplary embodiment of the present disclosure;

FIG. 2 is a cross-sectional view schematically illustrating another exemplary structure of a substrate processing system including a substrate support unit manufactured according to an exemplary embodiment of the present disclosure;

FIG. 3 is a flowchart sequentially showing a method for manufacturing an electrostatic chuck according to an exemplary embodiment of the present disclosure;

FIG. 4 is a first exemplary view explaining a method for manufacturing an electrostatic chuck according to an exemplary embodiment of the present disclosure;

FIG. 5 is a second exemplary view explaining a method for manufacturing an electrostatic chuck according to an exemplary embodiment of the present disclosure;

FIG. 6 is a third exemplary view explaining a method for manufacturing an electrostatic chuck according to an exemplary embodiment of the present disclosure; and FIG. 7 is a fourth exemplary view explaining a method for manufacturing an electrostatic chuck according to an exemplary embodiment of the present disclosure.

DETAILED DESCRIPTION OF THE EMBODIMENTS

Hereinafter, preferred embodiments of the present disclosure will be described in detail with reference to the accompanying drawings. Advantages and features of the present disclosure and methods of accomplishing the same may be understood more readily by reference to the following detailed description of preferred embodiments and the accompanying drawings. The present disclosure may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

Unless defined otherwise, all technical and scientific terms used herein have the same meaning as commonly understood by one of ordinary skill in the art to which this invention belongs. Further, unless defined otherwise, all terms defined in generally used dictionaries may not be overly interpreted.

Hereinafter, exemplary embodiments of the present disclosure will be described in detail with reference to the accompanying drawings. In the description with reference to the drawings, the same or corresponding elements are denoted by the same reference numerals, and a redundant description thereof will be omitted.

The present disclosure relates to an electrostatic chuck, which is manufactured to be reusable by removing a part of a dielectric layer except for a DC electrode and a heater electrode and depositing a new dielectric layer thereon, a method for manufacturing the electrostatic chuck, and a substrate processing system including the electrostatic chuck. A description is hereinafter made of the present disclosure with reference to accompanying drawings.

FIG. 1 is a cross-sectional view schematically illustrating an exemplary structure of a substrate processing system including a substrate support unit manufactured according to an exemplary embodiment of the present disclosure.

Referring to FIG. 1, a substrate processing system 100 may include a housing 110, a support unit 120, a plasma generation unit 130, a shower head unit 140, a first gas supply unit 150, a second gas supply unit 160, a liner 170, a baffle unit 180, and an upper module 190.

The substrate processing system 100 is a system for processing a substrate W through a dry etching process. The substrate processing system 100 may process the substrate W, for example, with a plasma process.

The housing 110 may provide a space for performing the plasma process. The housing 110 may be provided with an exhaust hole 111 on the bottom part thereof.

The exhaust hole 111 may be connected to an exhaust line 113 on which a pump 112 is mounted. The exhaust hole 111 may exhaust the reaction by-products produced during the plasma process and the gas remaining inside the housing 110 to the outside of the housing 110 through the exhaust line 113. In this case, the inner space of the housing 110 may be decompressed to a predetermined pressure.

The housing 110 may have an opening 114 formed on a sidewall thereof. The opening 114 may function as a passage through which the substrate W enters and exits the housing 110. The opening 114 may be configured to be opened and closed by a door assembly 115.

The door assembly 115 may include an outer door 115a and a door driver 115b. The outer door 115a may be formed on the outer wall of the housing 110. The outer door 115a may move in an up-down direction (i.e., third direction 30) by means of the door driver 115b. The door driver 115b may be driven by a motor, a hydraulic cylinder, a pneumatic cylinder, or the like.

The support unit 120 may be mounted on the bottom area inside the housing 110. The support unit 120 may support the substrate W using an electrostatic force. However, this embodiment is not limited thereto. The support unit 120 may support the substrate W in various manners such as using mechanical clamping or vacuum.

In the case where the support unit 120 supports the substrate W using the electrostatic force, the support unit 120 may include a base 121 and an electrostatic chuck (ESC) 122.

The electrostatic chuck (ESC) 122 may support the substrate settled on the upper part thereof using the electrostatic force. The electrostatic chuck 122 may be made of a ceramic material and fixedly connected onto the base 121.

The electrostatic chuck 122 may be mounted so as to move in the up-down direction (i.e., third direction 30) inside the housing 110 by means of a driving member (not shown). In the case where the electrostatic chuck 122 is mounted so as to move in the up-down direction, it may be possible to locate the substrate W at a position at which the plasma distribution is more uniform.

The electrostatic chuck 122 may be manufactured to be reusable by removing a part of a dielectric layer except for a DC electrode and a heater electrode, and depositing a new dielectric layer thereon. At this time, in the electrostatic chuck 122, the new dielectric layer may be deposited according to an aerosol deposition process. A more detailed description of the electrostatic chuck 122 will be described later.

A ring assembly 123 may be arranged to surround the edge of the electrostatic chuck 122. The ring assembly 123 has a ring shape and may be configured to support the edge region of the substrate W. The ring assembly 123 may include a focus ring 123a and an insulation ring 123b.

The focus ring 123a may be arranged inside the insulation ring 123b to surround the electrostatic chuck 122. The focus ring 123a may be made of a silicon material and may concentrate plasma on the substrate W.

The insulation ring 123b may be arranged outside the focus ring 123a to surround the focus ring 123a. The insulation ring 123b may be made of a quartz material.

Meanwhile, the ring assembly 123 may further include an edge ring (not shown) that is tightly adjoined to the edge of the focus ring 123a. The edge ring may be formed to prevent the side surface of the electrostatic chuck 122 from being damaged by the plasma.

The first gas supply unit 150 may supply gas for removing foreign substances remaining on top of the ring assembly 123 and around the edge of the electrostatic chuck 122. The first gas supply unit 150 may include a first gas supply source 151 and a first gas supply line 152.

The first gas supply source 151 may supply nitrogen (N2) gas for removing the foreign substances. However, this embodiment is not limited thereto. The first gas supply source 151 may supply different gas or a cleansing agent.

The first gas supply line 152 may be arranged between the electrostatic chuck 122 and the ring assembly 123. The first gas supply line 152 may be arranged to as to be connected between the electrostatic chuck 122 and the focus ring 123a.

The first gas supply line 152 may also be arranged inside the focus ring 123a and bent to be connected through the electrostatic chuck 122 and the focus ring 123a.

A heating member 124 and a cooling member 125 may be provided for the substrate W to maintain a process temperature during the etching process in the housing 110. For this purpose, the heating member 124 may be provided in the form of a heat line, and the cooling member 125 may be provided in the form of a cooling line in which a refrigerant is flowing.

The heating member 124 and the cooling member 125 may be installed inside the support unit 120 in order for the substrate W to maintain the process temperature. For example, the heating member 124 may be installed in the inside the electrostatic chuck 122, and the cooling member 125 may be installed in the inside the base 121.

Meanwhile, the cooling member 125 may be supplied with a coolant from a chiller 126. The chiller 126 may be installed outside the housing 110.

The plasma generation unit 130 may generate plasma with the gas remaining in a discharging space. Here, the discharging space may mean a space located above the support unit 120 in the inner space of the housing 110.

The plasma generation unit 130 may generate plasma in the discharging space inside the housing 100 with an inductively coupled plasma (ICP) source. In this case, the plasma generation unit 130 may use an antenna unit 193 installed in the upper module 190 as an upper electrode, and the electrostatic chuck 122 as a lower electrode.

However, this embodiment is not limited thereto. The plasma generation unit 130 may also generate plasma in the discharging space inside the housing 110 using a capacitively coupled plasma (CCP) source. In this case, the plasma generation unit 130 may use the shower head unit 140 as the upper electrode and the electrostatic chuck 122 as the lower electrode, as illustrated in FIG. 2. FIG. 2 is a cross-sectional view schematically illustrating another exemplary structure of a substrate processing system including a substrate support unit manufactured according to an exemplary embodiment of the present disclosure.

A description is made with reference to FIG. 1 again.

The plasma generation unit 130 may include an upper electrode, a lower electrode, an upper power source 131, and a lower power source 133.

The upper power source 131 applies power to the upper electrode, that is, the antenna unit 193. The upper power source 131 may be provided to control plasma characteristics. The upper power source 131 may be provided to control, for example, ion bombardment energy.

Although a single upper power source 131 is shown in FIG. 1, it may also be possible that a plurality of upper power sources are arranged in this embodiment. In the case where a plurality of upper power sources are arranged, the substrate processing system 100 may further include a first matching network (not shown) that is electrically connected to the plurality of upper power sources.

The first matching network may perform matching on the frequency powers having different magnitudes from the respective upper power sources and apply the frequency powers to the antenna unit 193.

Meanwhile, a first impedance matching circuit (not shown) may be arranged on a first transmission line 132 connecting the upper power source 131 to the antenna unit 193 for the purpose of impedance matching.

The first impedance matching circuit may operate as a lossless passive circuit for effectively (i.e., maximally) transferring the electric energy from the upper power source 131 to the antenna unit 193.

The lower power source 133 may apply power to the lower electrode, i.e., the electrostatic chuck 122. The lower power source 133 may act as a plasma source for generating plasma and control the characteristics of the plasma in cooperation with the upper power source 131.

Although a single lower power source 133 is shown in FIG. 1, it may also be possible that a plurality of lower power sources 133 is arranged in this embodiment in the same manner as the upper power source 131. In the case where a plurality of lower power sources are arranged, the substrate processing system 100 may further include a second matching network (not shown) that is electrically connected to the plurality of lower power sources.

The second matching network may perform matching on the frequency powers having different magnitudes from the respective lower power sources and apply the frequency powers to the electrostatic chuck 122.

Meanwhile, a second impedance matching circuit (not shown) may be arranged on a second transmission line 134 connecting the lower power source 133 to the electrostatic chuck 122 for the purpose of impedance matching.

The second impedance matching circuit may operate as a lossless passive circuit, in the same manner as the first impedance matching circuit, for effectively (i.e., maximally) transferring the electric energy from the lower power source 133 to the electrostatic chuck 122.

The shower head unit 140 may be installed so as to face the electrostatic chuck 122 in the up-down direction inside the housing 110. The shower head unit 140 may be provided with a plurality of gas feeding holes 141 for feeding gas into the inside of the housing and it may have a diameter greater than that of the electrostatic chuck 122.

Meanwhile, the shower head unit 140 may be made of a silicon material or metal material.

The second gas supply unit 160 may supply the process gas into the inside of the housing 110 through the shower head unit 140. The second gas supply unit 160 may include a second gas supply source 161 and a second gas supply line 162.

The second gas supply source 161 may supply etching gas as the process gas for use in processing the substrate W. The second gas supply source 161 may supply the gas including fluorine components (e.g., $SF_6$ gas and $CF_4$ gas) as the etching gas.

It may be possible that a single second gas supply source 161 is arranged for supplying the etching gas to the shower head unit 140. However, this embodiment is not limited thereto. It may also be possible that a plurality of second gas supply sources 161 are arranged for supplying the process gas to the shower head unit 140.

The second gas supply line 162 may connect the second gas supply source 161 to the shower head unit 140. The second gas supply line 162 may allow the process gas being supplied by the second gas supply source 161 to flow to the shower head unit 140 such that the etching gas flows into the inside of the housing 110.

Meanwhile, in the case where the shower head unit 140 is divided into a center zone, a middle zone, and an edge zone, the second gas supply unit 160 may further include a gas distributor (not shown) and a gas distribution line (not shown) for supplying the process gas to the respective zones of the shower head unit 140.

The gas distributor may distribute the process gas being supplied from the second gas supply source 161 to the respective zones of the shower head unit 140. The gas distributor may be connected to the second gas supply source 161 through the second gas supply line 161.

The gas distribution line may connect the gas distributor to the respective zones of the shower head unit 140. The gas distribution line may allow the process gas distributed by the gas distributor to flow into the respective zones of the shower head unit 140.

Meanwhile, the second gas supply unit 160 may further include a second gas supply source (not shown) for supplying deposition gas.

The second gas supply source may supply the deposition gas to the shower head unit 140 for enabling anisotropic etching by protecting the side surface of the substrate W. The second gas supply source may supply $C_4F_8$ gas or $C_2F_4$ gas as the deposition gas.

The liner 170 which is also referred to as a wall-liner may protect the inner surface of the housing 110 against arc discharge occurring during the impurities being produced during the excitation of the process gas and impurities being produced during the substrate processing process. The liner 170 may have a cylindrical shape opened at the upper and lower parts thereof inside the housing 110.

The liner 170 may be arranged on the inner wall of the housing 110. The liner 170 may be provided with a support ring 171 at the upper part thereof. The support ring 171 may be formed so as to protrude outward (i.e., in the first direction 10) at the upper part of the liner 170 and it may be arranged at the upper end of the housing 110 to support the liner 170.

The baffle unit 180 may exhaust the by-product of the plasma, unreacted gas, or the like. The baffle unit 180 may be installed between the inner wall of the housing 110 and the support unit 120.

The baffle unit 180 may have a ring shape and may be provided with a plurality of penetration holes penetrating in the up-down direction (i.e., third direction 30). The baffle unit 180 may control the flow of the process gas according to the number and shape of the penetration holes.

The upper module 190 is mounted to cover the open upper part of the housing 110. The upper module 190 may include a window member 191 and an antenna member 192.

The window member 191 is formed to cover the upper part of the housing 110 in order to seal the inner space of the housing 110. The window member 191 may be provided in a plate (e.g., circular plate) shape, and may be formed of an insulating material (e.g., alumina ($Al_2O_3$)).

The window member 191 may include a dielectric window. The window member 191 may be formed with a through hole through which the second gas supply line 162 is inserted. A coating film may be formed on the surface of the window member 191 to suppress generation of particles when a plasma process is performed in the housing 110.

The antenna member 192 may be mounted on the window member 191, and may include a space of a predetermined size so that the antenna unit 193 can be disposed therein.

The antenna member 192 may be formed in a cylindrical shape with an open bottom, the diameter of which corresponds to that of the housing 110. The antenna member 192 may be provided to be attachable/detachable to/from the window member 191.

The antenna unit 193 functions as the upper electrode, and is provided with a coil forming a closed loop. The antenna unit 193 may produce a magnetic field and an electric field inside the housing 100 based on the power supplied from the upper power source 131 to excite the gas, which is flown into the inside of the housing 110 through the shower head unit 140, into plasma.

The antenna unit 193 may be provided with a coil having a planar spiral shape. However, this embodiment is not limited thereto. It is obvious to those skilled in the art that the coil can be modified variously in structure and size.

Next, the electrostatic chuck 122 manufactured to be reusable is described. In this embodiment, in order to reuse the electrostatic chuck 122, the electrostatic chuck 122 may be manufactured by removing only a part of the dielectric layer and depositing a new dielectric layer thereon.

Conventionally, in order to reuse the electrostatic chuck 122, the entire dielectric layer including a DC electrode and a heater electrode was removed. In this embodiment, however, only the upper part of the dielectric layer may be partially removed while the DC electrode and the heater electrode are left unchanged. In this embodiment, a portion of the upper part of the dielectric layer having a thickness, for example, in a range of 1 µm to 50 µm may be removed.

When depositing the new dielectric layer, the aerosol deposition process may be applied. In this case, the thickness of the deposited dielectric layer may be in a range of 1 µm to 50 µm.

In this embodiment, since only the part of the dielectric layer is removed, it does not need to pattern an electrode again and laminate a dielectric layer, thereby significantly reducing manufacturing time and cost.

In the following, a method for manufacturing the electrostatic chuck 122 to be reusable is described in detail.

FIG. 3 is a flowchart sequentially showing a method for manufacturing an electrostatic chuck according to an exemplary embodiment of the present disclosure. The following description is made with reference to FIG. 3.

First, an electrostatic chuck 122 to be manufactured for reuse is prepared (step S210).

The electrostatic chuck 122 may include a first dielectric layer 320 formed on a metal plate (e.g., aluminum (Al) plate) 310, as shown in FIG. 4. FIG. 4 is a first exemplary view explaining a method for manufacturing an electrostatic chuck according to an exemplary embodiment of the present disclosure.

The first dielectric layer 320 may be formed by attaching it to the top of the metal plate 310 via an adhesive layer 330. In the first dielectric layer 320, a DC electrode (ESC DC electrode) 340 and a heater electrode 350 may be installed.

The DC electrode 340 functions to generate plasma inside the housing 110. The DC electrode 340 may be connected to the lower power source 133 to perform the above-described function. Regarding the lower power source 133, it has been explained in the description of the substrate processing systems 100 illustrated in FIGS. 1 and 2.

The heater electrode 350 is provided to maintain the temperature of the substrate W at a process temperature when the plasma process is performed in the housing 110. The heater electrode 350 is the same concept as the heating member 124 described with reference to FIGS. 1 and 2.

A dam 360 is formed at the upper part of the first dielectric layer 320. The dam 360 may be formed to protrude upward from the upper part of the first dielectric layer 320. A plurality of the dams 360 may be formed at the upper part of the first dielectric layer 320.

A plurality of dam 360 may be formed on the first dielectric layer 320 to have the same height. The height of the plurality of dam 360 may be, for example, in a range of 1 µm to 50 µm. The DC electrode 340 and the heater electrode 350 may be installed below the plurality of dam 360.

If the electrostatic chuck 122 has been used to process the substrate W, the plurality of dam 360 may not reach a reference height 370 and may have different heights due to plasma etching or the like. Therefore, regeneration of the dielectric layer is required to reuse the electrostatic chuck 122. FIG. 3 illustrates the method for resolving this problem.

The description with reference to FIG. 3 is continued.

When the electrostatic chuck 122 to be manufactured for reuse is prepared (step S210), the upper part of the first dielectric layer 320 is partially removed (step S220).

Specifically, as illustrated in FIG. 5, the dams 360 which had been formed on the first dielectric layer 320 to have the height ranging from 1 µm to 50 µm are removed. FIG. 5 is a second exemplary view explaining a method for manufacturing an electrostatic chuck according to an exemplary embodiment of the present disclosure.

Then, as shown in FIG. 6, a new dielectric layer, that is, a second dielectric layer 410 is deposited on the first dielectric layer 320 from which the dams 360 have been removed (step S230). FIG. 6 is a third exemplary view explaining a method for manufacturing an electrostatic chuck according to an exemplary embodiment of the present disclosure.

The second dielectric layer 410 may be deposited on the first dielectric layer 320 through the aerosol deposition process.

When the second dielectric layer 410 is deposited on the first dielectric layer 320 through the aerosol deposition process, the porosity of the second dielectric layer 410 may become 0.5% or less. Thus, the porosity can be reduced by 6 times or more in comparison with the porosity of about 3% in the atmospheric spray coating process. In this embodiment, it is possible to enhance a withstand voltage property and an electrostatic chucking force of the electrostatic chuck 122.

In addition, when the second dielectric layer 410 is deposited on the first dielectric layer 320 through the aerosol deposition process, the surface density of the second dielectric layer 410 is increased, thereby improving the etching resistance. Accordingly, it is possible to increase the lifetime of the electrostatic chuck 122.

However, this embodiment is not limited thereto. The second dielectric layer 410 may be deposited on the first dielectric layer 320 through a deposition process other than the aerosol deposition process.

Meanwhile, the second dielectric layer 410 may be deposited on the first dielectric layer 320 using the same material as the first dielectric layer 320. However, this embodiment is not limited thereto. The second dielectric layer 410 may be deposited on the first dielectric layer 320 using a material having high etching resistance. When the second dielectric layer 410 is deposited on the first dielectric layer 320 using the material having high etching resistance, in this embodiment, an effect of improving the etching resistance of the electrostatic chuck 122 can also be obtained.

When the second dielectric layer 410 is deposited on the first dielectric layer 320 using the material having high etching resistance, the second dielectric layer 410 may be formed of at least one material of, for example, aluminum nitride (AlN), silicon carbide (SiC), aluminum oxide ($Al_2O_3$), yttrium oxide ($Y_2O_3$), yttrium oxyfluoride (YOF), sapphire or the like.

Meanwhile, the second dielectric layer 410 may be deposited on the first dielectric layer 320 to have a height in a range of 1 μm to 50 μm.

The description with reference to FIG. 3 is continued.

When the second dielectric layer 410 is deposited on the first dielectric layer 320 (step S230), the second dielectric layer 410 is patterned (step S240). At this time, as illustrated in FIG. 7, the second dielectric layer 410 may be patterned so that a plurality of dams reaching the reference height 370 can be formed at the upper part of the second dielectric layer 410. FIG. 7 is a fourth exemplary view explaining a method for manufacturing an electrostatic chuck according to an exemplary embodiment of the present disclosure.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A method for manufacturing an electrostatic chuck, the method comprising:
   after using an electrostatic chuck (ESC), removing a portion of an upper part of a first dielectric layer of the electrostatic chuck where an electrode is not formed;
   depositing a second dielectric layer on the first dielectric layer from which the portion of the upper part has been removed; and
   patterning the second dielectric layer to expose portions of the first dielectric layer and enable reuse of the electrostatic chuck.

2. The method of claim 1, wherein a dam is installed at the upper part of the first dielectric layer, and
   the removing comprises removing the dam to remove the portion of the upper part.

3. The method of claim 1, wherein the depositing comprises depositing the second dielectric layer on the first dielectric layer using an aerosol deposition process.

4. The method of claim 1, wherein the depositing comprises depositing the second dielectric layer on the first dielectric layer such that the second dielectric layer has a height of 1 μm to 50 μm.

5. The method of claim 1, wherein the depositing comprises depositing the second dielectric layer on the first dielectric layer such that the second dielectric layer includes at least one component selected from the group consisting of aluminum nitride (AlN), silicon carbide (SiC), aluminum oxide ($Al_2O_3$), yttrium oxide ($Y_2O_3$), yttrium oxyfluoride (YOF), and sapphire.

6. The method of claim 1, wherein the patterning comprises patterning the second dielectric layer such that a dam is formed at an upper part of the second dielectric layer.

7. The method of claim 6, wherein the patterning comprises patterning the second dielectric layer to form a dam of the same type as a dam formed at the upper part of the first dielectric layer before using the electrostatic chuck.

8. The method of claim 7, wherein the dam formed at the upper part of the second dielectric layer has the same height as the dam formed at the upper part of the first dielectric layer before using the electrostatic chuck.

9. The method of claim 1, wherein the electrode includes a DC electrode used to process the substrate and a heater electrode used to control a temperature of the substrate.

10. The method of claim 2, wherein the removing comprises removing the dam if a height of the dam is not constant.

11. The method of claim 1, wherein the second dielectric layer includes the same component as the first dielectric layer, or a component having etching resistance.

12. A method for manufacturing an electrostatic chuck, the method comprising:
    after using an electrostatic chuck, removing a portion of an upper part of a first dielectric layer of the electrostatic chuck where an electrode is not formed;
    depositing a second dielectric layer on the first dielectric layer from which the portion of the upper part has been removed; and
    patterning the second dielectric layer to expose portions of the first dielectric layer and enable reuse of the electrostatic chuck,
    wherein a dam is installed at the upper part of the first dielectric layer,
    the removing comprises removing the dam to remove the portion of the upper part if a height of the dam is not constant,
    the patterning comprises patterning the second dielectric layer such that a dam is formed at an upper part of the second dielectric layer, and
    the second dielectric layer includes a component having etching resistance.

13. A substrate processing system comprising:
    a housing;
    a shower head unit installed on an upper side inside the housing to introduce a process gas for etching a substrate into the housing; and
    a support unit installed on a lower side inside the housing, the support unit including an electrostatic chuck on which the substrate is mounted, a base configured to support the electrostatic chuck, and a focus ring installed on a side surface of the electrostatic chuck,
    wherein the electrostatic chuck is manufactured by removing a portion of an upper part of a first dielectric layer of the electrostatic chuck where an electrode is not formed after the electrostatic chuck is used to process the substrate, depositing a second dielectric layer on the first dielectric layer from which the portion of the upper part has been removed, and patterning the second dielectric layer to expose portions of the first dielectric layer and enable reuse of the electrostatic chuck.

14. The substrate processing system of claim 13, wherein a dam is installed at the upper part of the first dielectric layer, and
    the dam is removed to remove the portion of the upper part if a height of the dam is not constant.

15. The substrate processing system of claim 13, wherein the second dielectric layer is patterned to form a dam at an upper part thereof.

16. The substrate processing system of claim 13, wherein the second dielectric layer includes the same component as the first dielectric layer, or a component having etching resistance.

17. The method of claim 1, wherein the depositing comprises depositing the second dielectric layer on the first dielectric layer such that a porosity of the second dielectric layer is 0.5% or less.

18. The method of claim 1, wherein the depositing comprises depositing the second dielectric layer using a deposition process other than the aerosol deposition process.

* * * * *